(12) United States Patent
Willis

(10) Patent No.: US 7,643,599 B2
(45) Date of Patent: Jan. 5, 2010

(54) METHOD AND APPARATUS FOR DETECTING LINEAR PHASE ERROR

(75) Inventor: Andre Willis, Menlo Park, CA (US)

(73) Assignee: SyntheSys Research, Inc., Menlo Park, CA (US)

( * ) Notice: Subject to any disclaimer, the term of this patent is extended or adjusted under 35 U.S.C. 154(b) by 22 days.

(21) Appl. No.: 11/371,320

(22) Filed: Mar. 7, 2006

(65) Prior Publication Data

US 2006/0210005 A1   Sep. 21, 2006

(51) Int. Cl.
*H04L 7/00* (2006.01)
*H04L 25/00* (2006.01)
*H04L 25/40* (2006.01)

(52) U.S. Cl. .......................................... 375/371; 327/12

(58) Field of Classification Search .................. 375/354, 375/371–377; 327/156, 163, 231–233, 236, 327/244, 256, 1, 2, 12
See application file for complete search history.

(56) References Cited

U.S. PATENT DOCUMENTS 6,151,356 A * 11/2000 Spagnoletti et al. ......... 375/226
6,483,871 B1 * 11/2002 Dawe ......................... 375/226
2004/0066872 A1 * 4/2004 Hsu ............................ 375/376

* cited by examiner

*Primary Examiner*—Shuwang Liu
*Assistant Examiner*—James M Perez
(74) *Attorney, Agent, or Firm*—Peninsula IP Group; Douglas Chaikin

(57) ABSTRACT

Disclosed herein is a method and apparatus used to detect phase error information between edges of an input data signal and a clock signal for use at ultra-high frequencies and where linear phase error information is required. This invention extends the usefulness of a given integrated circuit logic technology to twice the frequency range of application while maintaining the desired linear phase error measurement operation. Flip flops are used to sample the data input signal with the clocking signal and processing is done separately for rising and falling data edges. Analog recombination of phase error information from both edges is then done in a fashion that is not limited by the integrated circuit speed. This invention overcomes limitations of prior methods in that it operates in data applications, provides linear phase error information at very high phase-error bandwidth and can operate at the same maximum speed as the flip flop and logic process technology will allow by operating on bit cells that are a full 1-bit minimum rather than half-bit cells.

11 Claims, 3 Drawing Sheets

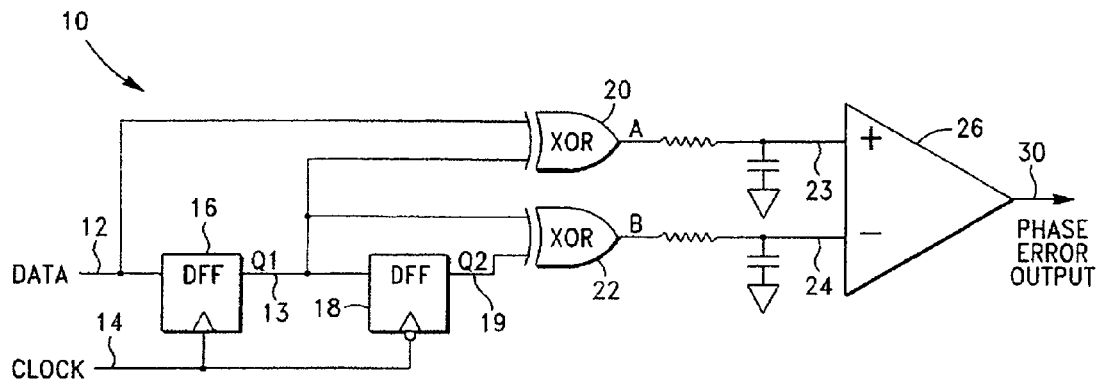
FIG.−1
PRIOR ART
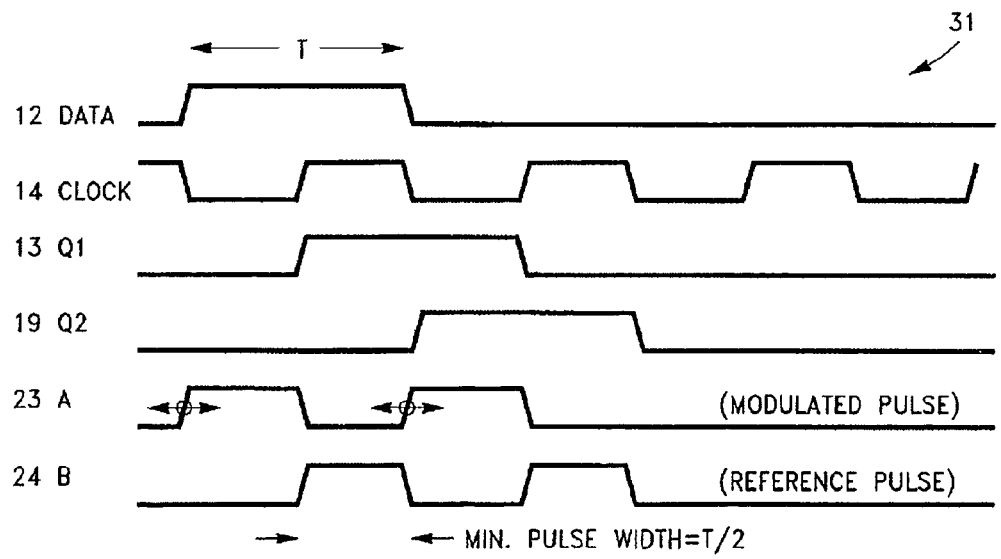
FIG.−2
PRIOR ART

METHOD AND APPARATUS FOR DETECTING LINEAR PHASE ERROR

BACKGROUND OF THE INVENTION

1. Field of the Invention

The present invention generally relates to systems and components that measure phase error between a clock signal and a related data signal, where the measurement must support fast-changing phase error results and where a linear function of phase error is still desired even at these high bandwidth, fast-changing phase error conditions. More particularly, the present invention relates to clock and data recovery systems that create reference clocking signals from an input data signal and also relates to phase error (e.g. jitter) measuring systems that must measure high-frequency jitter components.

2. Description of the Related Art

Phase detectors come in many variants and have been employed in phased-lock loop circuits found in synthesizers, clock and data recovery systems and phase error (e.g. jitter) measuring systems for many years. Each phase detector offers different trade-offs with respect to price and performance. Performance encompasses how well the various phase detectors perform at high speeds, with low jitter, having linear measurements in broadband (wide-ranging frequency) applications.

One of the first separations in phase detectors are that many phase detectors must match each edge of one input signal to a corresponding edge of the other input signal to monitor if one edge is earlier or later than the corresponding edge. These devices require that edges always be present on both signals (e.g. that clocking signals are used). For the application of clock recovery from a data stream or for measuring phase errors (e.g. jitter) in a data stream, this type of phase detector is not appropriate as data streams do not always possess edges at all bit positions. With respect to the present invention, only phase detectors that provide phase error information from data streams are considered relevant.

Phase detectors for data applications, too, have many variants depending on various metrics of performance. For example, for low cost and high level-of-integration reasons, many phase detectors must be implemented in integrated circuit technologies that have only switching transistors present which limits linear-type performance. The most common form of phase detector for data applications are variants of "bang-bang" phase detectors. These types of phase detectors can easily be implemented using digital switching techniques. In this style of detector, it is typical that a data edge is compared to an associated clocking edge and a digital bit or bits are set to one value if the data edge is in advance of the clock edge and the same digital bit or bits are set to another value if the data edge is behind the clock edge. By averaging a sufficient number of such digital bits or bit values, a more smoothly changing phase error estimate can be achieved. This type of detector is called a bang-bang detector because it only has feedback in two (sometimes three) states. That is, ahead or behind (sometimes a third state is introduced giving ahead, behind and hold—no information states). Bang-bang phase detectors can be made to look like linear-enough phase error measurements only when suitable averaging over many clock cells can be afforded. As less and less averaging is employed (as would be required to measure higher fidelity (frequency) phase error signals), the response of such a phase detector starts to look very chunky (e.g. either one state or the other). Hence the name, bang-bang. This behavior is not desirable when high-frequency phase error measurements are necessary as is the case in high-bandwidth clock and data recovery systems or phase error (jitter) measuring systems.

Linear phase detectors at high frequencies also exist. These devices also typically involve averaging; however, the averaged values are now not just a dissimilar number of one bits and zero bits. Instead, partial bits are used by pulse-width modulating the output of the phase detectors. These phase detectors output a pulse that has a width that, when compared to a reference width, not only communicates if the data edge is ahead or behind of the clock edge, but also communicates how far ahead or behind the data edge is with respect to the clock edge. A small difference would indicate a small phase error amount and a large difference would indicate a large phase error amount. These devices have the desirable affect of outputting a linear phase error signal (e.g. not a bang-bang signal) that can be efficiently accumulated (averaged) over only a very short amount of time to provide a linear measure of phase error.

Real-world signals at very high speeds, though, are plagued with the inevitable reality of limited rise and fall times. It is elementary to show that averaging the energy from pulse width modulation such as this becomes non-linear in cases of very short pulses, which can result from such phase detectors. In these cases, the pulse width modulated signal may never reach a full logic level before it must transition again to indicate a short pulse width. This "runt" pulse does not have all the energy that would be present in an ideally square edge. Averaging such a pulse stream would, too, not create the full voltage level ideally indicated by the pulse width measured by the phase detector only because of the non-ideal rise/fall times. This introduces the non-linearity of these devices used in this fashion.

For many systems, such non-linearity is not a problem. After all, the response is still monotonic even if it is not linear and so feedback systems such as phased-lock loops will still operate properly; however, for those applications that are truly relying on linear phase measurement or feedback, these types of phase detectors suffer.

Various techniques have been employed to avoid small output pulses for phase detectors used with clocking signals (e.g. not data applications). Such techniques often rely on dividing the input stream by an integer number (e.g. 2) in frequency using a T-type flip flop and then manipulating the use of the measurement in the application to operate about a point where pulses with plenty of pulse width exist. For example, operating a phased-lock loop at 90-degrees or 180-degrees out of phase so the phase measurements in the in lock state are nominally 50% duty cycle signals. This type of manipulation is not possible in data applications for phase-detectors.

The most direct comparison for the purpose of the state-of-the-art in linear, high-frequency phase detectors for data applications is what is know as the "Hogge" phase detector. This detector operates at very high frequencies (as well as low frequencies) and provides proportional phase error information (it is not a bang-bang phase detector). However, even this detector runs into implementation problems at very, very high frequencies because its design depends on operating with half-bit windows. Half-bit windows for data rate applications of 12.5 Gbit/sec amounts to 40 psec bit windows. In order to make 40 psec pulses that can reach their full 1/0 voltage limits, rise and fall times of less than 15 psec may be required. This is very difficult in today's modern high-speed technologies. Systems that operate by pulse-width modulating full bit windows offer more promise for maintaining good pulse-width shape (and therefore linearity of phase error measurement). A full bit window at 12.5 Gbit/sec amounts to 80 psec so rise/fall times of 30 psec could easily be employed with good linear results. This is more practical in today's integrated circuit and assembly technology.

Therefore, the current state of the art does not offer a linear, ultra-high speed phase detector technology that can be employed to make phase error sitter) measurements in data applications.

SUMMARY OF THE INVENTION

An object of the present invention is to provide a very high speed, high performance linear phase error detector that operates in data applications to compare a stream of incoming data bit edges to an input clock and producing a linear, proportional output signal which represents the phase error difference present between the data and clock input streams.

The present invention utilizes flip flop circuits and clocks them on the rising and falling edges of an incoming clock signal to sample the input data signal. The results of the sampling are further re-sampled and processed to derive individual phase measurement information for rising data edges and for falling data edges, relying on the observation that rising and falling transitions on the data waveform are, by definition, at least an entire bit cell apart. Once this is done, the two computed components of phase error information can be added in an analog fashion that does not compromise bandwidth. Improvement for the impact of speed limitations from today's highest-speed integrated circuit processes is attained as the result of increasing the minimum pulse widths that must be processed by any digital circuits to extend beyond one-half a bit cell. The minimum pulse width can be extended fully to one bit cell width, which extends the usefulness of such a phase detector to twice previous frequencies.

BRIEF DESCRIPTION OF THE DRAWING

For a further understanding of the objects and advantages of the present invention, reference should be had to the following detailed description, taken in conjunction with the accompanying drawing, in which like parts are given like reference numerals and wherein:

FIG. 1 is a schematic diagram of a traditional linear phase detector;

FIG. 2 is a timing diagram illustrating the signal processing and phase-error computation of the linear phase detector illustrated in FIG. 1;

DETAILED DESCRIPTION OF THE INVENTION

Figure 3:
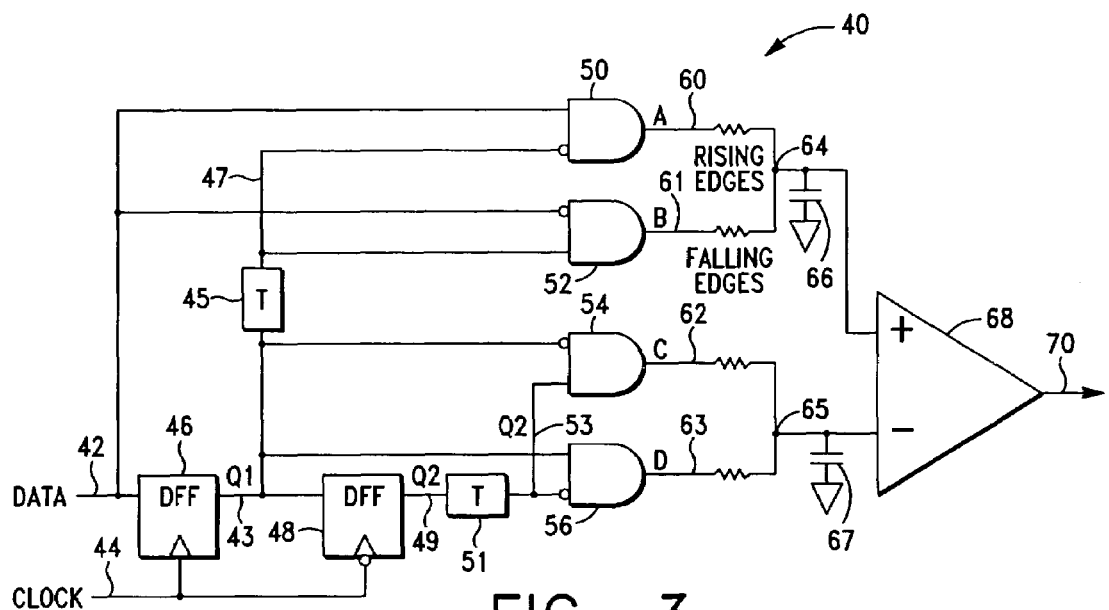
FIG. 3 is a schematic diagram of the phase detector according to an exemplary embodiment of the present invention.

The present invention will now be described in greater detail with reference to the accompanying drawings, in which an exemplary embodiment of the invention is shown. The present invention may, however, be embodied in many different forms and should not be construed as limited to the embodiment set forth herein; rather the embodiment is provided so that this disclosure will be thorough and complete and will fully convey the invention to those skilled in the art.

To fully understand the logic and benefits of the present invention, it is best to understand what happens in a traditional linear phase detector often used in high data rate applications. FIG. 1 is a schematic diagram of a traditional linear phase detector 10. An input data signal 12 has occasional edges which are to be compared to the appropriate corresponding edges of an accompanying clock signal 14 in order to compute an output phase error signal 30, proportional to the phase difference between the input data signal 12 edges and the clock signal 14 edges.

The input data signal 12 is presented to a first d-type flip flop 16 that is clocked on the rising edge of the input clock signal 14. The input data signal 12 is also provided as a first input of a first exclusive-OR (XOR) gate 20 which will be described more fully below. The output 13 of the first d-type flip flop 16 is provided as a second input of the first XOR gate 20. The output 13 of the first d-type flip flop 16 is also provided as a first input of a second XOR gate 22, as well as the input to a second d-type flip flop 18. The second d-type flip flop 18 which is sampled on the falling edge of the clock signal 14. The output 13 from the first d-type flip flop and the output 19 from the second d-type flip flop 18 are then combined (along with the original data input signal 12) to detect when there were changes in the sampled values in either flip flop. For example, the output of the first XOR gate 23 will go logic hi when the input data signal 12 is different than the output of the first d-type flip flop 13 and the output of the second XOR gate 24 will go logic hi when the output signal of the first flip flop 13 is different from the output signal of the second flip flop 19.

The width of the second XOR gate output 24 will be explicitly controlled by the applied clock signal 14 and will nominally be one-half a bit period wide. The width of the first XOR gate output 23 can vary as the location of edges of the data input signal 12 varies. If the input data signal edges start to shift, the corresponding output of the first XOR gate 23 will also shift. As shown in FIG. 1, the output of the first XOR gate 23 is provided to a low pass filter, and the filtered signal is provided to a first (e.g. positive) input of an operational amplifier 26. The output of the second XOR gate 24 is provided to a second low pass filter, with the filtered signal being provided to a second (e.g. negative) input of the operational amplifier 26. The output signal 30 of the operational amplifier 26 represents the phase error signal, which is computed by determining the difference between the averaged or filtered output signal of the first XOR gate 23 and the second XOR gate 24.

FIG. 2 is a timing diagram 31 illustrating the signal processing and phase error computation of the linear phase detector 10 illustrated in FIG. 1. In this figure, a single input data signal 12, having a pulse of width T is shown. Although not strictly necessary, the clock signal 14 is nominally centered to rise at the middle of the input data signal 12 pulse. From this figure, it can clearly be seen that the output signal of the first d-type flip flop 13 (Q1 value) is the sampled version of the input data signal 12 sampled at the rising edge of the applied clock signal 14 and that the output signal of the second d-type flip flop 19 (Q2 value) is the subsequently sampled version of the output of the first d-type flip flop 13 when sampled on the falling edge of the applied clock signal 14. In this figure, the output of the first XOR gate 23 and the output of the second XOR gate 24 are shown as the half-bit wide pulses that would be computed in this case. This figure also shows how the pulse width of the first XOR gate output 23 can change as the edges of the input data signal 12 changes. However, the pulse widths of the second XOR gate output 24 do not change and are set by the clock period.

A significant drawback associated with the aforementioned approach is therefore shown. The pulses that must be computed by the XOR gates result in half-bit (or smaller) pulses or signals. Signals with realistic rise and fall times would find it difficult to reach their full maximum values in such short periods which could either cause the aforementioned phase detector, or a larger circuit incorporating the aforementioned phase detector, not to work at all or could cause the output signal 30 to sum the averaged outputs of the first XOR gate 23 and the second XOR gate 24 in a way as to compute a phase error signal 30 that is not linear—i.e. some phase errors are computed right while others are amplified or attenuated).

FIG. 3 is a schematic diagram of a phase detector 40 operating according to the principles of the present invention. As shown, the phase detector 40 uses two additional logic gates 54, 56 as well as inserting delays, via delay elements 45, 51 into some of the processing paths. However, these are considered acceptable trade-offs in order to achieve high speed, more linear operation of the phase detector 40. An input data signal 42 is provided as a first input to and sampled by a first d-type flip flop 46 during the rising edge of a corresponding clock signal 44, that is provided to the clock input of the first d-type flip flop 46. The sampled input data signal 43 is provided as a first input to and is re-sampled by a second d-type flip flop 48 on the falling edge of the clock signal 44, that is provided to the clock input of the second d-type flip flop 48. The sampled input data signal 43 and the re-sampled input data signal 49 are then used to generate the individual rising edge and falling edge signals 60-63 that are filtered and combined and result in the phase error signal 70 provided by the phase detector 40 of the present invention.

The input data signal 42 is provided as a first input to a first AND gate 50. The sampled input data signal 43 is provided to a delay element 45, for example, a buffer or length of wiring trace, which provides a delayed version of the sampled input data signal 47. The amount of delay provided by the delay element 45 may vary depending on implementation; however, in the illustrated embodiment, the delay provided by the delay element 45 is set at one half a bit period for the highest data rate application. For example, at 12.5 Gbit/sec applications, a bit period is 80 psec, so this delay is set to 40 psec. The delayed sampled input data signal 47 is provided to the inverted second input to the first AND gate 50. In this manner, rising edge pulses (e.g. signals) 60, representing the difference between the input data signal 42 and the clock signal 44 is provided at the output of the first AND gate 50.

The input data signal 42 is also provided to the inverted first input of a second AND gate 52. The delayed sampled input data signal 47 is provided to the second input of the second AND gate 52. In this manner, falling edge pulses (e.g. signals) 61, representing the difference between the input data signal 42 and the clock signal 44 along the falling edge of the clock is provided at the output of the second AND gate 52. As shown, the rising and falling edge signals 60,61 are independently determined.

The sampled input signal 43 is provided to the inverted first input of a third AND gate 53 on the rising edge of the clock signal 44. The re-sampled input signal 49 is provided to a second delay element 51, which delays the application of the re-sampled input signal 53 by one half a bit period for the highest data rate application, e.g. 40 psec. The delayed re-sampled input signal 53 is provided to the second input of the third AND gate 53. In this manner, falling edge pulses (e.g. signals) 62 representing the difference between the re-sampled data signal 53 and the clock signal 44 is provided by the output of the third AND gate 53.

The sampled input data signal 43 is provided to a first input of a fourth AND gate 54. The delayed re-sampled data signal 53 is provided to the inverted second input of the fourth AND gate 54. In this manner, rising edge pulses (e.g. signals) 63, representing the difference between the sampled input data signal 43 and the clock signal 44 is provided at the output of the fourth AND gate 53. As shown, the rising edge signals 60,62 and the falling edge signals 61,63 are independently determined.

The delay inserted in the processing paths, and the separate and independent computation of rising and falling pulses 60-63 is critical to this invention's success. The separate computation enables taking advantage of the fact that there must be a falling edge between any two rising edges. This doubles the allowable time period for processing at the highest data rates such that parallel processing can be done. With this achieved, the delay can then be used to stretch the pulse of any given pulse to the maximum it can without encroaching on time potentially needed for an upcoming next decision. The phase detector 40 of the present invention can also be used in multi-data rate applications, as the amount of delay can either be programmable or could be fixed based on the maximum data rate to be used. Note that if the pulse width stretching sufficiently allows operation at the maximum data rate, then it will most certainly also allow proper operation at any lower data rate where the data period, T, is even longer.

Once the several rising and falling edge pulses 60-63 are determined using the delayed sampled signals 47,53 (to maximize the pulse widths), the change-detections for the first d-type flip flop 46 and the change detectors for the second d-type flip flop 48 are individually added using analog resistive combiners, shown as nodes 64,65. For example, the rising edge signal 60 and the falling edge signal 61 are added as combiner 64; whereas, the falling edge signal 62 and the rising edge signal 63 are added at combiner 65. Although shown as nodes, the analog combiner can be implemented, for example, using adder circuits. This analog addition is assured to be linearly independent of output pulse shape as it is then low-pass filtered, via capacitors 66, 67 to create average voltages for both the first and second flip flop change results. These average voltage signals 64', 65' are provided to at the inputs of an operational amplifier 68. The difference in these average voltages 64', 65' are used to compute the phase error signal 70.

Figure 4:
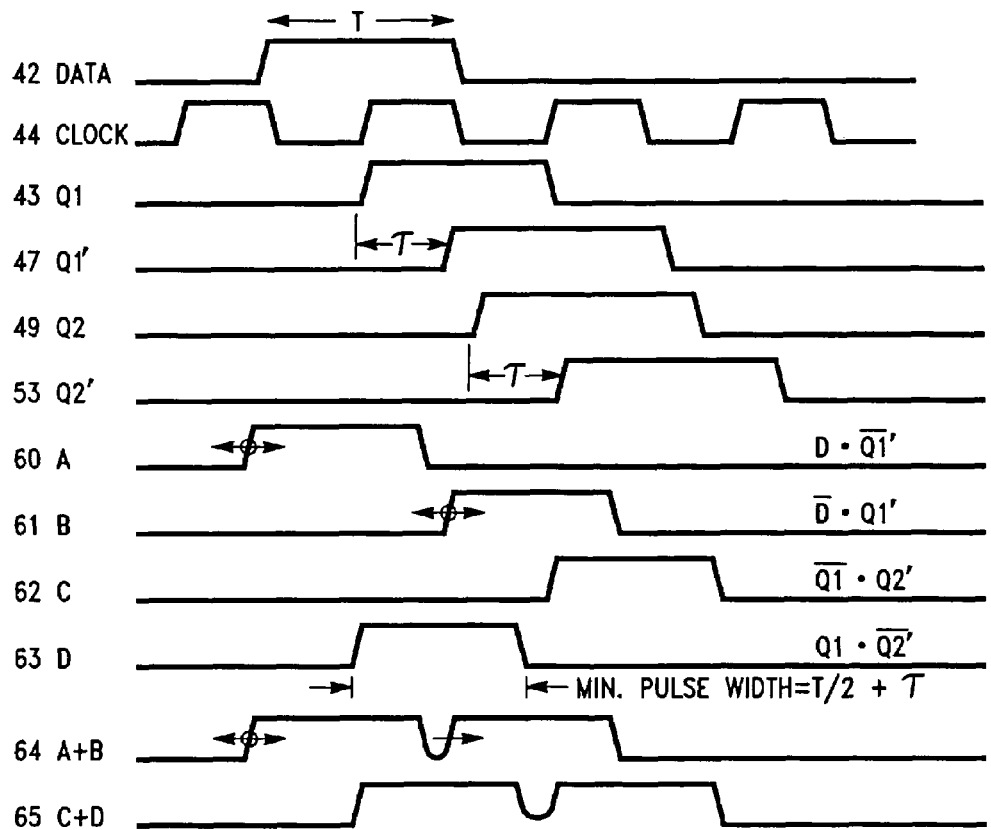
FIG. 4 is a timing diagram illustrating the signal processing and phase-error computation of the phase detector illustrated in FIG. 3.

FIG. 4 is a timing diagram illustrating the signal processing and phase error computation of the phase detector 40 according to the present invention. In this illustration, a single data pulse signal 42 is used as an example. The output signal 43 of the first d-type flip flop 46 (Q1) and the output signal 49 of the second d-type flip flop 48 (Q2) hold the sampled input data signal 42 and the re-sampled input data signal 43 on the rising and then falling edge of the clock signal 44. The delayed sampled input data signal 47 (Q1') is a copy of the sampled input data signal 43, delayed by a time amount, tau. In the exemplary embodiment, tau is set to any value up to one-half a bit period for the highest data rate application being used. For example, for 80 psec bit periods present for 12.5 Gbit/sec data rate applications, a delay up to 40 psec can be used. Similarly, The delayed re-sampled input data signal 49 (Q2') is a copy of the re-sampled input data signal 43 delayed by the same time amount, tau.

It can be appreciated that the first rising edge values 60 represent the movement of rising data edges while the first falling edge values 61 represent the movement of falling data edges. The second falling edge value 62 and second rising edge values 63 represent fixed pulse widths as defined by the input clock signal 44. Once individually computed using the AND gates 50, 52, 54, 56, the rising and falling edge values 60-63 are them summed or combined. This summing is done using analog voltage summing provided by summing the voltage nodes directly. This form of suming is very high bandwidth. Other forms of high bandwidth summing can also be used. The result of the suming is then low-pass filtered for example, by using an RC-type filter, and the difference between the sums of A+B and C+D is determined using a difference amplifier 68 to compute the phase difference error signal 70.

Figure 5:
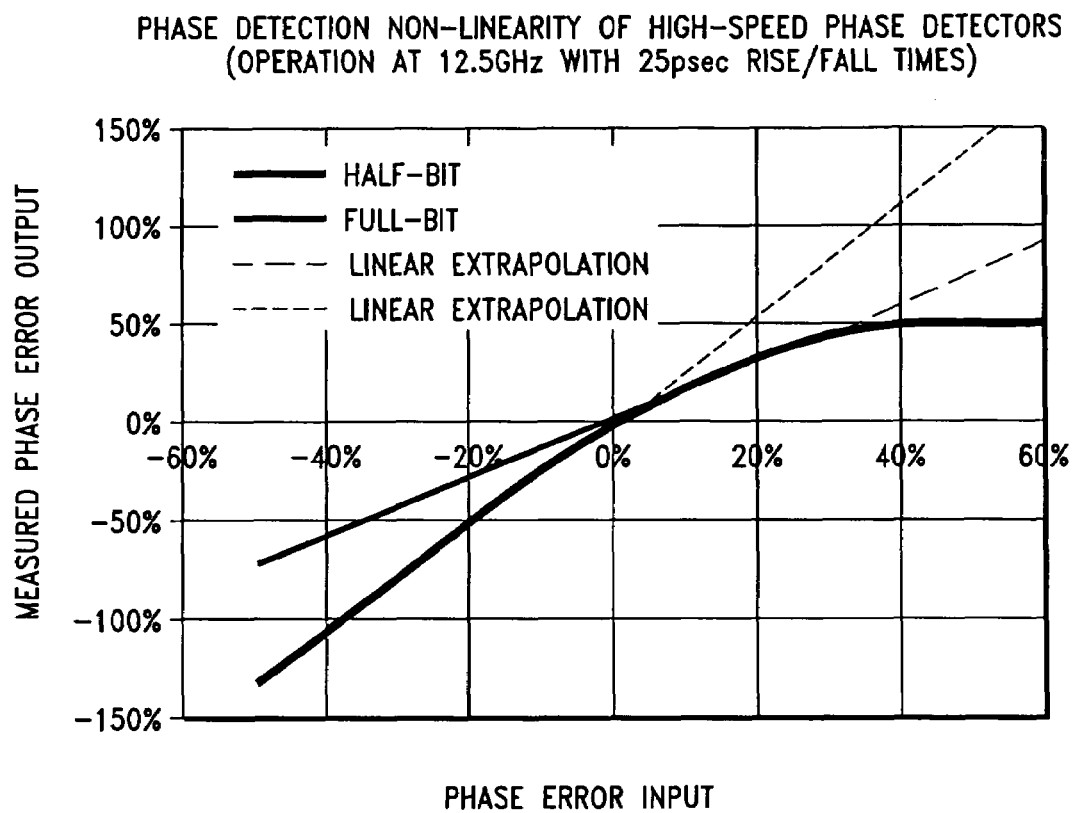
FIG. 5 is a graph of Phase Error Input versus Measured Phase Error Output for high-speed phase detectors showing the impact of real-world rise/fall time limits on phase measurements in pulse width modulated signals.

FIG. 5 is a graph of Phase Error Input versus Measured Phase Error Output illustrating the impact of real-world rise/fall time limits on phase measurements in pulse width modulated signals. This graph shows two traces that correspond to the measured phase error output of a phase detector that operates on half-bit windows (e.g. a Hogge detector) as well as the measured phase error output from the phase detector of the present invention that utilized full-bit windows. Both responses also show how the curves deviate from a dotted-line linear extrapolation. It is clear from FIG. 5 that the full-bit trace (on top) deviates less from the linear extrapolation than the half-bit trace (on bottom). This demonstrates the defect present in the half-bit system and the performance improvement of this invention.

The disclosed phase detector and corresponding method overcome the limitations of past linear phase detectors for use in high-speed applications by separately processing rising edge information and falling edge information to extend the amount of time that either processing needs to be completed in. This extended time allows the output pulse widths to be significantly longer, therefore extending the frequency range that linear phase detection can be accomplished.

While the foregoing detailed description has described several exemplary embodiments of the specific method for linear phase error detection, it is to be understood that the above description is illustrative only and is not limiting of the disclosed invention. Particularly other configurations are within the scope and sprit of this invention. Thus, the invention is to be limited only by the claims set forth below.

What is claimed is:

1. A linear phase error detection method, comprising:
   sampling an input data signal;
   delaying the sampled input data signal;
   generating rising and falling edge change signals corresponding to the difference between the input data signal and the delayed sampled input data signal along the rising and falling edge of a corresponding sampling clock signal;
   re-sampling the input data signal;
   delaying the re-sampled input data signal;
   generating rising and falling edge change signals corresponding to the difference between the sampled input data signal and the delayed re-sampled input data signal along the rising and falling edge of the corresponding sampling clock signal; and
   adding the rising and falling edge change signals respectively corresponding to the delayed sampled input data signal and the delayed re-sampled input data signal.

2. The phase error detection method of claim 1, further including combining the signal values resulting from adding the rising and falling edge change signals respectively corresponding to the delayed sampled input data signal and the delayed re-sampled input data signal.

3. The phase error detection method of claim 2, further including the step of filtering the added rising and falling edge change signals before the step of combining the signal values resulting from the addition of the rising and falling edge signals.

4. The phase error detection method of claim 1, wherein the input data signal is sampled on a rising edge of a corresponding clock signal.

5. The phase error detection method of claim 4, wherein the input data signal is re-sampled on a falling edge of the corresponding clock signal.

6. The phase error detection method of claim 1, wherein the rising and falling edge change signals corresponding to the difference between the input data signal and the delayed sampled input data signal are independently generated.

7. The phase error detection method of claim 1, wherein the rising and falling edge change signals corresponding to the delayed re-sampled input data signal are independently generated.

8. A phase detector, comprising:
   a sampling circuit, operative to sample an input data signal in response to a clock signal;
   a delay circuit, coupled to the sampling circuit, operative to provide a delayed sampling signal;
   a first change detection circuit operative to generate a rising edge phase signal representing the phase difference between the input data signal and the delayed sampling signal on the rising edge of the clock signal;
   a second change detection circuit operative to generate a falling edge phase signal representing the phase difference between the input data signal and the delayed sampling signal on the falling edge of the clock signal, the rising edge phase signal and the falling edge phase signal being generated independently of one another;
   a re-sampling circuit operative to sample the previously sampled input data signal in response to a falling edge of the clock signal;
   a combiner circuit operative sum the rising edge phase signal and the falling edge phase signal; and
   an amplifier operative to generate a phase error signal in response to the summed rising edge phase signal and the falling edge phase signal.

9. The phase detector of claim 8, further including a second delay circuit operative to generate a delayed re-sampling signal; and a third change detection circuit operative to generate a second falling edge phase signal representing the phase difference between the sampled input data signal and the delayed re-sampled data signal on the falling edge of the clock signal, the second falling edge phase signal generated independently of the rising edge signal and the falling edge signal.

10. The phase detector of claim 9, further including a fourth change detection circuit operative to generate a second rising edge signal representing the difference between the sampled input data signal and the delayed re-sampled signal on the rising edge of the clock signal, the second rising edge signal being generated independently of the second falling edge signal.

11. The phase detector of claim 10, further including a second combiner circuit operative to combine the second rising edge signal and the second falling edge signal, the combined signal being provided to a second input of the amplifier.

* * * * *